United States Patent
Hattori et al.

(10) Patent No.: US 9,060,432 B2
(45) Date of Patent: Jun. 16, 2015

(54) FLEXIBLE CIRCUIT BOARD AND METHOD FOR PRODUCING SAME AND BEND STRUCTURE OF FLEXIBLE CIRCUIT BOARD

(75) Inventors: Koichi Hattori, Kisarazu (JP); Keiichi Kimura, Tokyo (JP); Naoya Kuwasaki, Kitakyushu (JP)

(73) Assignee: NIPPON STEEL & SUMIKIN CHEMICAL CO., LTD., Tokyo (JP)

( * ) Notice: Subject to any disclaimer, the term of this patent is extended or adjusted under 35 U.S.C. 154(b) by 318 days.

(21) Appl. No.: 13/001,946

(22) PCT Filed: Jun. 25, 2009

(86) PCT No.: PCT/JP2009/061644
§ 371 (c)(1),
(2), (4) Date: Dec. 29, 2010

(87) PCT Pub. No.: WO2010/001812
PCT Pub. Date: Jan. 7, 2010

(65) Prior Publication Data
US 2011/0132643 A1 Jun. 9, 2011

(30) Foreign Application Priority Data

Jun. 30, 2008 (JP) ................. 2008-171791
Aug. 26, 2008 (JP) ................. 2008-216547

(51) Int. Cl.
*H05K 1/09* (2006.01)
*H05K 3/00* (2006.01)
(Continued)

(52) U.S. Cl.
CPC ........... *H05K 1/028* (2013.01); *Y10T 29/49155* (2015.01); *B21B 1/40* (2013.01);
(Continued)

(58) Field of Classification Search
CPC .................. H05K 1/028; H05K 1/09

USPC ............ 174/254; 29/829, 831, 842, 844, 851
See application file for complete search history.

(56) References Cited

U.S. PATENT DOCUMENTS 5,516,989 A * 5/1996 Uedo et al. ............... 174/254
6,689,235 B2 * 2/2004 Hatano et al. ............. 148/681
(Continued)

FOREIGN PATENT DOCUMENTS

JP 3009383 B2 2/2000
JP 2001-58203 A 3/2001
(Continued)

OTHER PUBLICATIONS

International Search Report for PCT/JP2009/061644, mailed on Oct. 6, 2009.
(Continued)

*Primary Examiner* — William H Mayo, III
*Assistant Examiner* — Hiram E Gonzalez
(74) *Attorney, Agent, or Firm* — Birch, Stewart, Kolasch & Birch, LLP (57) ABSTRACT

Provided are a flexible circuit board with excellent bendability and durability against hard conditions particularly in a repeated bend portion having a small curvature radius, and a method of producing the same. The flexible circuit board includes a resin layer and a wiring formed of a metal foil and is used with a bend portion provided at least one position of the wiring. The metal foil is made of a metal having a cubic crystal structure, and a cross section of the wiring cut in a thickness direction from a ridge line in the bend portion forms a principal orientation on any one of planes within a range of (20 1 0) to (1 20 0) in a rotation direction from (100) to (110) with [001] set as a zone axis. The wiring is formed so that the metal foil is made of a metal having a cubic crystal structure, and that the ridge line in the bend portion has an angle in a range of 2.9° to 87.1° relative to one of fundamental crystal axes <100> in a surface of the metal foil.

4 Claims, 6 Drawing Sheets (51) Int. Cl.
*H05K 1/02* (2006.01)
*C22F 1/08* (2006.01)
*B21B 1/40* (2006.01)
*B21B 3/00* (2006.01)
*H05K 1/03* (2006.01)

(52) U.S. Cl.
CPC ............ *B21B 2003/005* (2013.01); *C22F 1/08* (2013.01); *H05K 1/0393* (2013.01); *H05K 1/09* (2013.01); *H05K 2201/0355* (2013.01); *H05K 2203/0143* (2013.01)

(56) References Cited

U.S. PATENT DOCUMENTS

| | | | |
|---|---|---|---|
| 6,911,605 B2* | 6/2005 | Okada et al. | 174/256 |
| 2005/0018409 A1* | 1/2005 | Hirakata | 361/752 |
| 2007/0146975 A1 | 6/2007 | Chen et al. | |
| 2008/0099110 A1* | 5/2008 | Muroga et al. | 148/684 |

FOREIGN PATENT DOCUMENTS

| | | |
|---|---|---|
| JP | 2002-171033 A | 6/2002 |
| JP | 2002-300247 A | 10/2002 |
| JP | 2003-193211 A | 7/2003 |
| JP | 2005-5413 A | 1/2005 |
| JP | 2007-107036 A | 4/2007 |
| JP | 2008-38170 A | 2/2008 |
| JP | 2008-106313 A | 5/2008 |
| WO | WO 2008/050584 A1 | 5/2008 |

OTHER PUBLICATIONS

International Preliminary Report on Patentability and Written Opinion of the International Searching Authority, dated Jan. 13, 2011, for International Application No. PCT/JP2009/061644 (Forms PCT/IB/326, PCT/IB/373 and PCT/ISA/237).

Translation of International Preliminary Report on Patentability and Written Opinion of the International Searching Authority, dated Feb. 17, 2011, for International Application No. PCT/JP2009/061644 (Forms PCT/IB/338, PCT/IB/373 and PCT/ISA/237).

Extended European Search Report dated Nov. 8, 2011 for Application No. 09773390.1.

Extended European Search Report issued May 26, 2014, in European Patent Application No. 14157869.0.

* cited by examiner

FLEXIBLE CIRCUIT BOARD AND METHOD FOR PRODUCING SAME AND BEND STRUCTURE OF FLEXIBLE CIRCUIT BOARD

This application is the National Phase of PCT/JP2009/061644 filed on Jun. 25, 2009, which claims priority under 35 U.S.C. §119(a) to Patent Application Nos. 2008-171791 and 2008-216547 filed in Japan on Jun. 30, 2008 and Aug. 26, 2008, respectively, all of which are hereby expressly incorporated by reference into the present application.

TECHNICAL FIELD

The present invention relates to a flexible circuit board used with a bend portion provided at any position, a method of producing the same, and a bend structure of the flexible circuit board, and more particularly, to a flexible circuit board which is durable against bending and exhibits excellent bendability, a method of producing the same, and a bend structure of the flexible circuit board.

BACKGROUND ART

A flexible circuit board (flexible printed board) including a resin layer and a wiring made of a metal foil may be used in a bending state, and thus is widely used for various electronic or electrical devices including a movable portion contained in a hard disk drive, a hinge portion or slide portion of a mobile phone, a head portion of a printer, an optical pickup portion, and a movable portion of a notebook PC. In recent times, particularly, with downsizing and thinning of the devices and an improvement of a function thereof, the flexible circuit board requires the bendability which may be folded for compact storage in a limited space and respond to various movements of the electronic devices. Therefore, in order to respond to bending in which a curvature radius of a bend portion becomes smaller or an operation in which folding is frequently repeated, it is necessary to further improve mechanical characteristics including the strength of a flexible circuit board.

In general, the wiring rather than the resin layer is responsible for a defect resulting from poor strength against the repetition of folding or the bending at the small curvature radius. When the wiring becomes difficult to resist the repetition of folding or the bending, the wiring is cracked or broken in part and becomes no longer usable for a circuit board. Therefore, in order to reduce a bending stress applied to the wiring, for example, in a hinge portion, there have been proposed a flexible circuit board in which a wiring is inclined relative to a turning axis (see Patent Literature 1) and a method in which a spiral portion obtained by at least one turn in the turning direction of the hinge portion and the number of turns is increased to suppress a change in diameter of the spiral portion accompanying an open and close operation, to thereby reduce damage (see Patent Literature 2). However, in any of such methods, a design of the flexible circuit board is limited.

In contrast, there has been reported that excellent bendability is exhibited in a case where $I/I_0>20$ is satisfied between an intensity (I) of a (200) plane which is obtained by X-ray diffraction of a rolled surface of a rolled copper foil (X-ray diffraction in thickness direction of copper foil) and an intensity ($I_0$) of a (200) plane which is obtained by X-ray diffraction of a copper fine powder (Patent Literatures 3 and 4). That is, the bendability of the copper foil is improved with the development of a cubic orientation which is a recrystallized texture of copper. Therefore, a known copper foil suitable as a wiring material of the flexible circuit board is one in which the degree of development of a cubic texture is defined based on the parameter ($I/I_0$) described above. There is also a report that an excellent bending strength is obtained when the rolled copper foil has a crystal structure in which an occupied ratio of crystal grains oriented in an orientation allowing a principal slip plane to be active against bending deformation is equal to or larger than 80% in area ratio as observed from a rolled surface (see paragraph 0013 in Patent Literature 5). The description of the specification of this literature may assume that a state in which a cross section of a bent wiring is oriented in {100} is suitable.

CITATION LIST

Patent Literature

[PTL 1]: JP 2002-171033 A
[PTL 2]: JP 2002-300247 A
[PTL 3]: JP 2001-58203 A
[PTL 4]: JP 3009383 B
[PTL 5]: JP 2007-107036 A

SUMMARY OF INVENTION

Technical Problem

In view of the circumstances, the present invention provides a flexible circuit board which is not limited in design, has a strength capable of resisting repetition of folding or bending at a small curvature radius, and exhibits excellent bendability. As a result of intensive studies, the inventors of the present invention surprisingly obtained new findings that a bending strength is improved and bendability is excellent in a case where a metal foil having a cubic crystal structure is bent at a predetermined angle relative to a crystal axis thereof. Then, the inventors of the present invention have found that a flexible circuit board which is excellent in bend durability and bendability is obtained based on the findings as described above, and thus completed the present invention.

Therefore, an object of the present invention is to provide a flexible circuit board with excellent bendability and durability against hard conditions particularly in a repeated bend portion having a small curvature radius, for example, a hinge portion or slide portion of a mobile phone or small-size electronic device.

Another object of the present invention is to provide a flexible circuit board producing method with which a flexible circuit board having excellent bend durability and bendability is obtained without being limited in design.

Further, still another object of the present invention is to provide a bend structure of a flexible circuit board with excellent bendability and durability against hard conditions particularly in a repeated bend portion having a small curvature radius, for example, a hinge portion or slide portion of a mobile phone or small-size electronic device.

Solution to Problem

As a result of intensive studies to solve the problems of the conventional technologies, the gist of the present invention has the following structures.

(1) A flexible circuit board including a resin layer and a wiring formed of a metal foil, to be used with a bend portion provided at least one position of the wiring, in which: the metal foil is made of a metal having a cubic crystal structure; and a cross section of the wiring cut in a thickness direction from a ridge line in the bend portion forms a principal orientation on any one of planes within a range of (20 1 0) to (1 20 0) in a rotation direction from (100) to (110) with [001] set as a zone axis.

(2) A flexible circuit board according to Item (1), in which the cross section of the wiring cut in the thickness direction from the ridge line in the bend portion is any one of planes located on a line segment joining a point indicating (20 1 0) with a point indicating (110) in a stereo triangle of a standard projection diagram of (100).

(3) A flexible circuit board according to Item (1) or (2), in which: the metal foil is a copper foil; and $I/I_0 \geq 25$ is satisfied between an intensity (I) of a (200) plane of the copper foil in the thickness direction, which is obtained by X-ray diffraction, and an intensity ($I_0$) of a (200) plane of a copper fine powder which is obtained by X-ray diffraction.

(4) A flexible circuit board according to Item (1) or (2), in which: the metal foil is made of a metal having a face-centered cubic structure; the principal orientation is provided so that an occupied area ratio of a preferred-oriented region in which a fundamental crystal axis <100> of a unit lattice of the face-centered cubic structure is within an orientation difference of 10° relative to two orthogonal axes of the thickness direction of the metal foil and a direction in a foil surface is equal to or larger than 50%; and a normal to the cross section of the wiring cut in the thickness direction of the metal foil from the ridge line in the bend portion has an angle in a range of 2.9° to 87.1° relative to a principal orientation of <100> in the foil surface.

(5) A flexible circuit board according to any one of Items (1) to (4), in which the metal foil is a rolled copper foil having a thickness in a range of 5 μm to 100 μm.

(6) A flexible circuit board according to any one of Items (1) to (5), in which the bend portion is formed with a repeated operation selected from the group consisting of sliding bending, fold bending, hinge bending, and slide bending.

(7) A flexible circuit board according to any one of Items (1) to (6), in which the wiring is formed along a direction orthogonal to the ridge line at the bend portion.

(8) A flexible circuit board according to any one of Items (1) to (7), wherein the resin layer is made of polyimide.

(9) A bend structure of a flexible circuit board including a resin layer and a wiring formed of a metal foil, to be used with a bend portion provided at least one position of the wiring, in which: the metal foil is made of a metal having a cubic crystal structure; and a cross section of the wiring cut in a thickness direction from a ridge line in the bend portion forms a principal orientation on any one of planes within a range of (20 1 0) to (1 20 0) in a rotation direction from (100) to (110) with [001] set as a zone axis.

(10) A bend structure of a flexible circuit board according to Item (9), in which the cross section of the wiring cut in the thickness direction from the ridge line in the bend portion is any one of planes located on a line segment joining a point indicating (20 1 0) with a point indicating (110) in a stereo triangle of a standard projection diagram of (100).

(11) A method of producing a flexible circuit board including a resin layer and a wiring formed of a metal foil, to be used with a bend portion provided at least one position of the wiring, the method including forming the wiring so that the metal foil includes a metal having a cubic crystal structure and a ridge line in the bend portion has an angle in a range of 2.9° to 87.1° relative to one of fundamental crystal axes <100> in a surface of the metal foil.

(12) A method of producing a flexible circuit board according to Item (11), in which: the metal foil is a copper foil; and $I/I_0 \geq 25$ is satisfied between an intensity (I) of a (200) plane of the copper foil in the thickness direction, which is obtained by X-ray diffraction, and an intensity ($I_0$) of a (200) plane of a copper fine powder which is obtained by X-ray diffraction.

(13) A method of producing a flexible circuit board according to Item (12), in which the forming includes performing thermal treatment on a rolled metal foil having a face-centered cubic structure to exhibit a cubic texture so that an occupied area ratio of a preferred-oriented region in which a fundamental crystal axis <100> of a unit lattice of the face-centered cubic structure is within an orientation difference of 10° relative to two orthogonal axes of the thickness direction of the metal foil and a direction in a foil surface is equal to or larger than 50%.

(14) A method of producing a flexible circuit board according to any one of Items (11) to (13), in which the bend portion is formed with a repeated operation selected from the group consisting of sliding bending, fold bending, hinge bending, and slide bending.

(15) A method of producing a flexible circuit board according to any one of Items (11) to (14), in which the wiring in which the forming includes forming along a direction orthogonal to the ridge line at the bend portion.

(16) An electronic device, which installs therein the flexible circuit board according to any one of Items (1) to (8).

Advantageous Effects of Invention

According to the present invention, when the flexible circuit board is bent, shear slip of the bend portion in a principal distortion direction easily occurs, thereby obtaining functions and effects that breakage is less likely to occur. Further, metal fatigue against repeated distortion is less likely to occur. Besides, metal fatigue against stress is less likely to occur. Therefore, it is possible to provide a flexible circuit board which has a strength capable of resisting repetition of folding or bending at a small curvature radius and exhibits excellent bendability, without being limited in design. As a result, highly-durable electronic devices including a thin mobile phone, a thin display, a hard disk drive, a printer, and a DVD drive may be realized.

DESCRIPTION OF EMBODIMENTS

A wiring of a flexible circuit board according to the present invention is made of a metal foil containing a metal having a cubic crystal structure. In a case of a face-centered cubic crystal, known examples of the metal having the cubic crystal structure include copper, aluminum, nickel, silver, rhodium, palladium, platinum, and gold. In a case of a body-centered cubic crystal, for example, iron, chromium, molybdenum, and tungsten have been known. Any of them may be used. In view of availability as the metal foil, copper, aluminum, and nickel are suitable and, of them, a copper foil, which is mainly used for the wiring of the flexible circuit board, is most general. The metal foil may be any of a rolled foil and an electrolytic foil, and preferably a rolled foil. For example, the copper foil is desirably a rolled copper foil having a thickness in a range of 5 μm to 100 μm, advantageously in a range of 5 μm to 20 μm, and more advantageously in a range of 5 μm to 12 μm. The rolled copper foil may contain an alloy element, but is desirably a complete solid solution.

Figure 1:
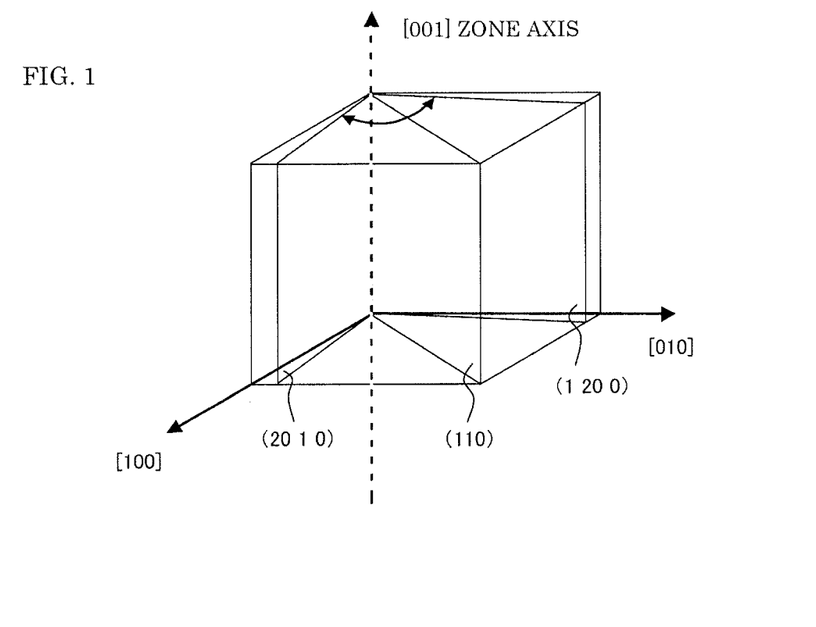
FIG. 1 illustrates relationships between a zone axis and planes obtained by rotation about the zone axis in a cubic crystal structure.
Figure 2:
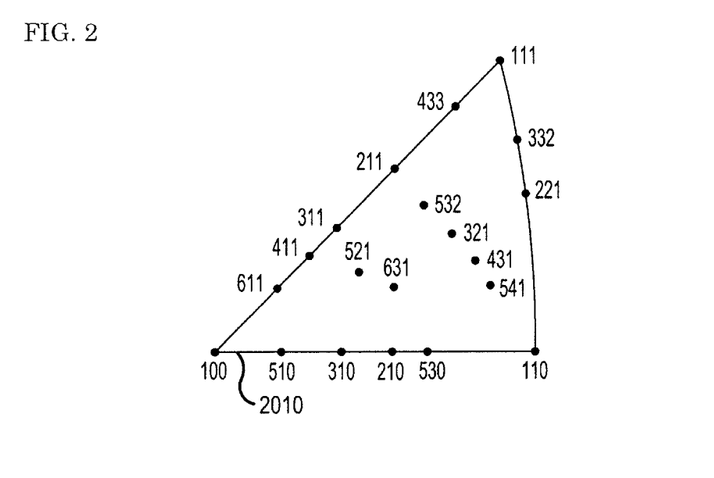
FIG. 2 illustrates a stereo triangle of a (100) standard projection diagram.

The metal foil for forming circuits in the flexible circuit board according to the present invention is required to be made of the metal having the cubic crystal structure and to be provided so that a cross section P of a wiring cut in a thickness direction from a ridge line in a bend portion forms a principal orientation on any plane within a range of (20 1 0) to (1 20 0) with [001] set as a zone axis. Relationships between the zone axis and plane orientations are illustrated in FIG. 1. With [001] set as a common axis, namely, the zone axis, (20 1 0) and (1 20 0) are associated with each other and within a rotation plane from (100) to (110) [from (100) to (010)] about [001] as the axis. That is, when this is plotted on an inverse pole figure of the orientation of the normal to the cross section P, the respective planes of (001), (20 1 0), and (110) are those as illustrated in FIG. 2. In view of symmetry, (1 20 0) is located at the same position as (20 1 0) on the inverse pole figure. The metal of the metal foil in the present invention has the cubic crystal. Crystal axes of a unit lattice of the cubic crystal are [100], [010], and [001]. In the present invention, when there is a priority orientation of <100> in the thickness direction of the metal foil (direction perpendicular to surface of metal foil), such an axis is expressed as [001], that is, a foil surface orientation is expressed as (001). In view of the symmetry of the cubic crystal, even when the axes are interchanged, the axes are equivalent to each other and naturally encompassed in the present invention.

The metal foil in the present invention is not necessarily a single crystal. However, it is necessary to form a texture in at least the bend portion by three-dimensional preferred orientation. A crystal orientation which is the center of preferred orientations is referred to as a principal orientation of the texture. There are some indexes for the priority of the preferred orientation of the texture, that is, an orientation degree or an integration degree. In the present invention, indexes based on an X-ray diffraction intensity and objective data using statistical data of local three-dimensional orientation data obtained by electron beam diffraction are used. A range of a preferred orientation degree of the metal foil in the present invention is described below.

In a typical structure of the flexible circuit board according to the present invention, a three-dimensional crystal orientation of the metal foil is defined in a specimen coordinate system of the metal foil included in circuits and a desired integration degree of a texture is defined in the following range. That is, in at least the bend portion, the metal having the cubic crystal exhibits a preferred orientation in which an occupied area ratio of a region in which one of fundamental crystal axes of a unit lattice of the metal, for example, a [001] axis is located within an orientation difference of 10° relative to the thickness direction of the metal foil (direction perpendicular to surface of metal foil) is equal to or larger than 50%, desirably equal to or larger than 75%, and more desirably equal to or larger than 98%, and exhibits a preferred orientation in which an occupied area ratio of a region in which another one of the fundamental crystal axes which is set as the principal orientation in a lateral foil surface to the surface of the metal foil (also referred to as principal surface or foil surface) is located within an orientation difference of 10° from the principal orientation is equal to or larger than 50%, desirably equal to or larger than 85%, and more desirably equal to or larger than 99%. The principal orientation in the foil surface is required to have an angle in a range of 2.9° to 87.1° [(20 1 0) to (1 20 0)] relative to a principal distortion direction of the bend portion, that is, the direction of the normal to the cross section of the wiring (perpendicular to cross section P of wiring) cut in the thickness direction from the ridge line in the bend portion. The angle is preferably in a range of 5.7° to 84.3° [(10 1 0) to (1 10 0)], more preferably in a range of 11.4° to 78.6° [(510) to (150)], still more preferably in a range of 26.6° to 63.4° [(210) to (120)], and most preferably 30° or 60° [(40 23 0) or (23 40 0)]. Note that, numbers in [ ] indicate a plane orientation of the cross section P corresponding to each angle.

According to the present invention, when the circuits are bent, shear slip of the bend portion in the principal stress direction easily occurs, and hence breaking extension increases and breaking is less likely to occur. Even in a case where repeated distortion or stress is applied, metal fatigue is less likely to occur, and hence a flexible circuit board having high bendability is obtained. That is, in a suitable example of the flexible circuit board according to the present invention, the metal foil has the face-centered cubic structure and the principal surface of the metal foil is preferred-oriented in the principal orientation of (001). In addition to this, the cross section P of the wiring cut in the thickness direction from the ridge line in the bend portion is preferred-oriented in a specific orientation between (20 1 0) and (1 20 0) as the principal orientation, preferably preferred-oriented in a specific orientation between (10 1 0) and (1 10 0) as the principal orientation, more preferably preferred-oriented in a specific orientation between (510) and (110) as the principal orientation, still more preferably preferred-oriented in a specific orientation between (210) and (110) as the principal orientation, and most preferably preferred-oriented in an orientation close to (40 23 0) as a central orientation. In a case of a metal foil of which a foil surface is preferred-oriented in (001) as the principal orientation, other unit lattice axes (100) and (010) in the foil surface are equivalent. Therefore, the principal orientation of the cross section P of the wiring cut in the thickness direction from the ridge line in the bend portion of the flexible circuit board according to the present invention may be defined as a specific orientation between (1 20 0) and (110). The cross section P may be defined to be preferably preferred-oriented in a specific orientation between (120) and (110) as the principal orientation, and most preferably preferred-oriented in an orientation close to (23 40 0) as the principal orientation.

Figure 3:
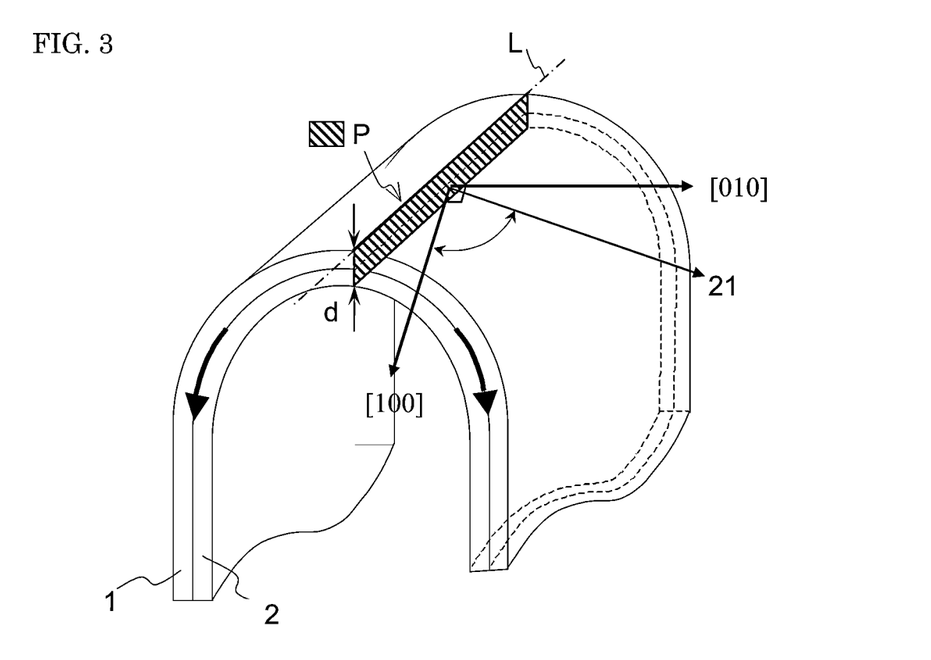
FIG. 3 is an explanatory cross-sectional view illustrating a state in which a flexible circuit board is bent.

The cross section P of the wiring cut in the thickness direction from the ridge line in the bend portion is a cross section corresponding to a wiring portion, obtained by cutting in the direction of a thickness "d" of the flexible circuit board from a ridge line L formed outside the flexible circuit board when the flexible circuit board is bent into a U-shape as illustrated in, for example, FIG. 3. The ridge line L is a line joining vertexes to one another, which are formed when the flexible circuit board is bent and the cross section of the flexible circuit board is viewed along the folding directions (bold arrows of FIG. 3). Note that, a case where the ridge line L is shifted on the flexible circuit board, for example, a case of sliding bending described later is also included. FIG. 3 illustrates a state in which a resin layer 1 is located outside and a wiring 2 is bent inside (assume that side on which circle having curvature radius is inscribed is "inside"). The wiring 2 may naturally be folded to be located outside.

In various uses, when a displacement is forced into a curvature, mainly a tensile or compression stress is applied to the metal foil. Which part of the bent flexible circuit board undergoes tensile or compression depends on the structure including the metal foil and the resin. The destruction of metal in a part which is outside bending and farthest from a neutral axis (or neutral plane) between tension and compression is generally hard, and the tension stress in the direction of the normal to the cross section of the wiring cut in the thickness direction from the ridge line in the bend portion is a principal stress. That is, the direction of the principal stress of the wiring in the bend port ion is a direction indicated by an arrow 21 of FIG. 3, and is typically a direction which is the same as the direction of the normal to the cross section P of the wiring cut in the thickness direction of the metal foil from the ridge line in the bend portion and which is perpendicular to the [001] axis oriented in the thickness direction of the metal foil.

In the present invention, the normal 21 to the cross section P of the wiring cut in the thickness direction of the metal foil from the ridge line in the bend portion is set to have an angle in a range of 2.9° to 45° relative to the fundamental crystal axis <100> in the surface of the metal foil. In view of the symmetry of crystal, the scope of the present invention may be defined as forming the wiring so that the fundamental crystal axis <100> in the surface of the metal foil has an angle in a range of 2.9° to 87.1° relative to the normal 21 to the cross section P of the wiring cut in the thickness direction of the metal foil from the ridge line in the bend portion. The ridge line in the bend portion and the normal 21 to the cross section P of the wiring cut in the thickness direction of the metal foil from the ridge line are orthogonal to each other and the principal orientations [100] and [010] in the surface of the metal foil are orthogonal to each other. Therefore, the scope of the present invention may be also defined as forming the wiring so that the fundamental crystal axis <100> in the surface of the metal foil has an angle in a range of 2.9° to 87.1° relative to the ridge line of the metal foil.

Figure 4:
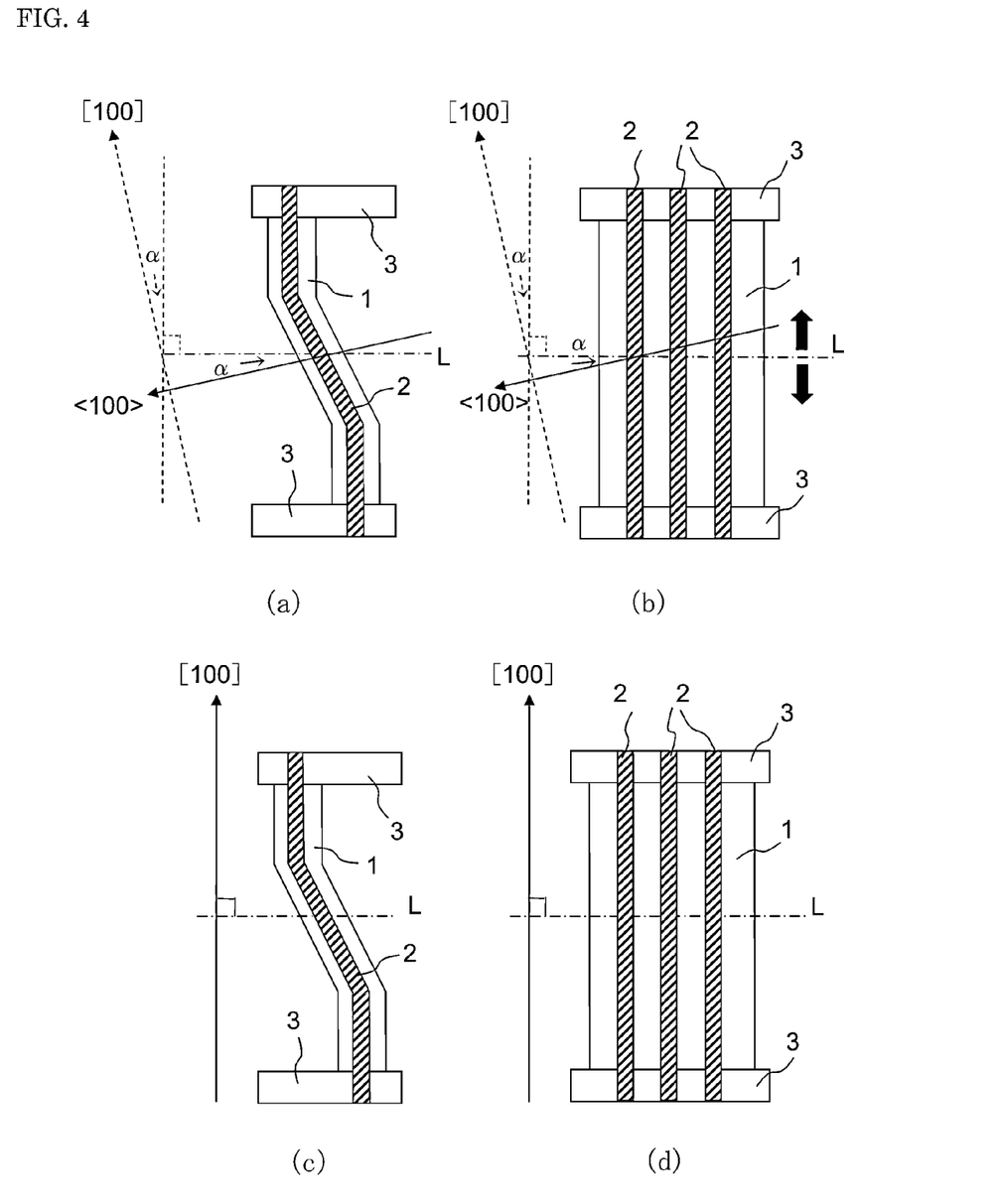
FIG. 4 are explanatory plan views illustrating relationships between a wiring and a crystal axis of a metal foil in the flexible circuit board, in which (a) and (b) illustrate a flexible circuit board according to the present invention and (c) and (d) illustrate a conventional flexible circuit board according to a conventional technology.

Considering mechanical characteristics of the metal foil of the flexible circuit board, a stress distortion characteristic of the metal foil subjected to simple tension in the principal stress direction indicated by the arrow 21 of FIG. 3 is an important characteristic. As illustrated in examples of FIGS. 4(c) and 4(d), when a metal foil having a cubic crystal structure is bent to form a ridge line orthogonal to a [100] axis thereof, the cross section of the wiring cut in the thickness direction of the flexible circuit board from the ridge line in the bend portion is a (100) plane. The inventors of the present invention obtained new findings that, as illustrated in FIG. 1, when the cross section P of the wiring cut in the thickness direction from the ridge line in the bend portion forms a principal orientation on any plane within a range of (20 1 0) to (1 20 0) (double-headed arrow of the figure) in a rotation direction from (100) to (010) with [001] set as the zone axis, the bending fatigue life of the wiring lengthens. In view of more significant improvement of such a bending fatigue characteristic, the cross section P of the wiring preferably forms the principal orientation on any plane within a range of (10 1 0) to (1 10 0), more preferably forms the principal orientation on any plane within a range of (510) to (150), still more preferably forms the principal orientation on any plane within a range of (210) to (120), and most preferably forms the principal orientation in (40 23 0) or (23 40 0). FIG. 1 illustrates the range of (20 1 0) to (1 20 0), but the cubic crystal structure has a plane equivalent to a plane within the range. Therefore, an equivalent plane different in sign from the plane of the cross section of the wiring which is within the range of (20 1 0) to (1 20 0) is included in the present invention.

In the present invention, the cross section P of the wiring cut in the thickness direction from the ridge line in the bend portion is preferred-oriented in the specific orientation between (20 1 0) and (1 20 0) as the principal orientation. Therefore, the reason why the fatigue characteristic is excellent against repeated bending is that, when a tensile stress is applied in the direction of the normal to the cross section P, that is, the principal stress direction, out of eight slip planes {111} of, for example, a metal having a face-centered cubic structure, four principal slip planes have a maximum Schmid factor, and hence shear slip is excellent and local work hardening is less likely to occur. In the case of a normal rolled copper foil, the longitudinal direction of the metal foil corresponds to the rolling direction, and hence circuits are normally formed along the principal orientation <100> as illustrated in FIGS. 4(c) and 4(d). An example described in Patent Literature 5 corresponds to the structure illustrated in FIG. 4(d). Thus, in the case where the orientation of the cross section of the wiring cut in the thickness direction from the ridge line in the bend portion is set to (100), when the metal foil is bent, the Schmid factors of the eight slip planes become equal to one another. Therefore, eight slip systems simultaneously act, and hence dislocations are easily locally accumulated. There is such a difference from the conventional technologies, and hence the bending resistance characteristic of the flexible circuit board according to an embodiment of the present invention is superior to the normal structure.

With respect to the cross section P in the flexible circuit board according to the present invention, the most desired orientation is 30° or 60° relative to the principal distortion direction in the bend portion, that is, the direction of the normal to the cross section of the wiring cut in the thickness direction from the ridge line in the bend portion. This is because the stress direction is aligned with the stable orientation of tension. Considering the mechanism described above, the thickness direction of the metal foil is not necessarily aligned with the principal orientation of [001]. The cross section P of the wiring cut in the thickness direction from the ridge line in the bend portion only needs to be preferred-oriented in the specific orientation between (20 1 0) and (1 20 0) as the principal orientation with [001] set as the zone axis.

In the present invention, the metal foil does not necessarily include a single crystal. However, in order to obtain the effects as described above, it is desired to form the three-dimensionally preferred-oriented texture having a high integration degree. For example, when the metal foil is a copper foil, a wiring having a predetermined pattern is desirably formed from the copper foil in which $I/I_0 \geq 25$ is satisfied between an intensity (I) of (002) perpendicular to the zone axis, which is obtained by X-ray diffraction (which is intensity of (200) plane in general notation of X-ray diffraction) and an intensity ($I_0$) of a (200) plane of a copper fine powder which is obtained by X-ray diffraction. $I/I_0$ is preferably in a range of 33 to 150, more preferably in a range of 50 to 150. The parameter $I/I_0$ exhibits an orientation degree of the zone axis with respect to (100) and (110), that is, the common axis [001], and is an objective index indicating the degree of development of a cubic texture. In a case where the metal foil is a rolled copper foil, when the foil is strongly processed at a given rolling reduction ratio or more and then recrystallized by heating, a recrystallized cubic orientation is developed in which the rolled foil surface is the principal orientation of (001) and the foil in-plane rolling direction is the principal orientation of (100). As the cubic orientation which is the recrystallized texture of copper is developed, the bending fatigue life of the copper foil is improved. In the case of the flexible circuit board according to the present invention, when $I/I_0$ is smaller than 25, the improvement of the bending fatigue life of the wiring is not sufficiently achieved. When $I/I_0$ is equal to or larger than 33, the improvement of the bending fatigue life of the wiring becomes significant. Note that, in a case where $I/I_0$ exceeds 150, for example, when annealing is performed to obtain the recrystallized texture as described later, thermal hysteresis becomes too large and thus is likely to adversely affect the resin layer except for the wiring and an interface state between the wiring and the resin layer. Note that, X-ray diffraction of the copper foil in the thickness direction is performed to determine an orientation in the surface of the copper foil (rolled surface in a case of rolled copper foil), and the intensity (I) of the (200) plane exhibits an intensity integral value of the (200) plane which is obtained by X-ray diffraction. The intensity ($I_0$) exhibits an intensity integral value of the (200) plane of the copper fine powder (produced by KANTO CHEMICAL CO., INC., copper powder reagent, first grade, 325 mesh).

When $I/I_0$ is to be increased to a value equal to or larger than 25, it is necessary to obtain the recrystallized texture of the copper foil and thus the means is not particularly limited. For example, as described in Patent Literature 4, annealing immediately before final cold rolling is performed in a condition in which an average size of recrystallized grains obtained by annealing is in a range of 5 μm to 20 μm, and the degree of rolling processing in the subsequent final cold rolling is increased to a value equal to or larger than 90%. Therefore, a rolled copper foil satisfying $I/I_0 25$ may be obtained. For example, a resin layer and a rolled copper foil may be laminated to obtain a copper-clad laminate and then the copper foil may be subjected to heating under a heating condition in which a temperature is in a range of 300° C. to 360° C. and an integral time is five minutes or longer, to obtain the recrystallized texture of the copper foil.

In order to define the texture by a three-dimensional integration degree, the texture may be determined based on an area ratio of a preferred-oriented region located within 10° relative to the principal orientation of the texture. That is, any crystal orientation of a predetermined surface of the metal foil may be determined by, for example, an electron diffraction method including an electron back scattering pattern (EBSP) method or an electron channeling pattern (ECP) method, or an X-ray diffraction method including a micro-Laue method. Of those methods, the EBSP method is a method of performing crystal analysis based on a diffraction image called a pseudo-Kikuchi line generated from each crystal plane when a surface of a specimen which is a measurement target is irradiated with a convergent electron beam, and measuring a crystal orientation distribution of the measurement target based on orientation data and position information of measurement points. The EBSP method may be used for crystal orientation analysis of a texture in a micro region as compared with the X-ray diffraction method. For example, crystal orientations may be determined for respective micro regions and combined for mapping. When each region in which an inclination (orientation difference) of a plane orientation between respective mapping points is equal to or smaller than a given value is colored with the same color to highlight a distribution of regions (crystal grains) having substantially the same plane orientation, an orientation mapping image may be obtained. When an orientation plane having an orientation within a predetermined angle relative to a specific plane orientation is defined to be included in the orientation, an existence ratio of each plane orientation may be obtained based on an area ratio.

In the EBSP method, when an area ratio of a region located within a predetermined angle relative to a specific orientation is to be calculated, it is necessary to finely scan, with an electron beam, a region larger than at least a circuit bend region of the flexible circuit board according to the present invention, and to set the number of points sufficient to calculate the area ratio, to thereby obtain information on the average. However, in the case of the metal foil, which is the target in the present invention, in view of a target circuit size, a region equal in size to or larger than 0.005 mm$^2$ needs to be measured at 1,000 or more points to calculate an average area ratio.

In the present invention, the foil surface of the metal foil is preferred-oriented in (001) as the principal orientation and the cross section P of the wiring cut in the thickness direction from the ridge line in the bend portion has the specific orientation between (20 1 0) and (1 20 0) as the principal orientation. Therefore, it may also be said that, when the inverse pole figure is displayed on the stereo triangle of the (100) standard projection diagram illustrated in FIG. 2, the orientation of the cross section of the wiring cut in the thickness direction from the ridge line in the bend portion corresponds to any plane located on a line segment joining the point indicating (20 1 0) with the point indicating (110). In the flexible circuit board according to the present invention, it may also be said that, when a wiring is made of a 3 (2)-axis-oriented material with the thickness direction of the metal foil being the [001] axis, the normal to the cross section of the wiring cut in the thickness direction from the ridge line in the bend portion has the angle in the range of 2.9° to 87.1° relative to the [100] axis in the foil surface.

With respect to the resin layer of the flexible circuit board according to the present invention, a kind of resin of the resin layer is not particularly limited, and thus a resin used for a normal flexible circuit board may be available and examples thereof include polyimide, polyamide, polyester, liquid crystal polymer, polyphenylene sulfide, and polyether ether ketone. Of them, polyimide and liquid crystal polymer are suitable because of excellent flexibility and high heat resistance when used as the circuit board.

A thickness of the resin layer may be set as appropriate depending on the use or shape of the flexible circuit board. In view of flexibility, the thickness is preferably in a range of 5 μm to 75 μm, more preferably in a range of 9 μm to 50 μm, and most preferably in a range of 10 μm to 30 μm. When the thickness of the resin layer is smaller than 5 μm, it is likely to reduce insulation reliability. In contrast to this, when the thickness exceeds 75 μm, the thickness of the entire circuit board is likely to become too thick when the circuit board is mounted on a small device, and hence bendability may be reduced.

With respect to means for laminating the resin layer and the metal foil, for example, when the resin layer is made of polyimide, thermoplastic polyimide may be applied to a polyimide film or interposed therebetween to thermally laminate the metal foil (so-called laminate method). Examples of the polyimide film used in the laminate method may include "Kapton" (DU PONT-TORAY CO., LTD.), "Apical" (KANEKA CORPORATION), and "Upilex" (UBE INDUSTRIES, LTD.). When the polyimide film and the metal foil are bonded to each other by thermal compression, a thermoplastic polyimide resin having thermoplasticity is desirably interposed therebetween. In order to easily control the thickness of the resin layer and the folding characteristic, a polyimide precursor solution (also called a polyamide acid solution) may be applied to the metal foil and then dried and cured to obtain a laminate (so-called cast method).

The resin layer may be formed by laminating a plurality of resins. For example, two or more kinds of polyimides having different linear expansion coefficients may be laminated. In this case, in order to maintain the heat resistance and bendability, the entire resin film is desirably made substantially of polyimide without using an epoxy resin as a bonding material.

In the flexible circuit board according to the present invention, the linear expansion coefficient of the resin layer is preferably set in a range of 10 ppm/° C. to 30 ppm/° C. When the resin layer is made of a plurality of resins, the linear expansion coefficient of the entire resin layer is desirably set in the range. In order to satisfy such a condition, for example, the resin layer includes: a low-linear expansion polyimide layer having a linear expansion coefficient equal to or smaller than 25 ppm/° C., preferably in a range of 5 ppm/° C. to 20 ppm/° C.; and a high-linear expansion polyimide layer having a linear expansion coefficient equal to or larger than 26 ppm/° C., preferably in a range of 30 ppm/° C. to 80 ppm/° C. Through adjustment to a thickness ratio between the polyimide layers, the linear expansion coefficient may be set in the range of 10 ppm/° C. to 30 ppm/° C. A desired thickness ratio between the low-linear expansion polyimide layer and the high-linear expansion polyimide layer is in a range of 70:30 to 95:5. The low-linear expansion polyimide layer is preferably provided as a principal resin layer of the resin layer and the high-linear expansion polyimide layer is preferably provided in contact with the metal foil. Note that, the linear expansion coefficient may be calculated from an average linear expansion coefficient in a range of 240° C. to 100° C. obtained in a case where polyimide in which imidization reaction is completed is used as a specimen, increased in temperature to 250° C. by a thromomechanical analyzer (TMA), and then cooled at a rate of 10° C./minutes.

The flexible circuit board according to the present invention includes the resin layer and the wiring having the metal foil is used with the bend portion provided at any position. That is, the flexible circuit board is widely used for various electronic or electrical devices including a movable portion contained in a hard disk drive, a hinge portion or slide portion of a mobile phone, a head portion of a printer, an optical pickup portion, and a movable portion of a notebook PC. The circuit board itself is folded, twisted, or deformed depending on the operation of a device on which the circuit board is mounted, thereby providing the bend portion at any position. In particular, the flexible circuit board according to the present invention has the bend structure which is excellent in bend durability, and hence the circuit board is suitable for a case where folding is frequently performed with repeated operations including sliding bending, fold bending, hinge bending, and slide bending, or a case of a hard use condition in which a curvature radius for fold behavior is in a range of 0.38 mm to 2.0 mm, a curvature radius for sliding bending is in a range of 1.25 mm to 2.0 mm, a curvature radius for hinge bending is in a range of 3.0 mm to 5.0 mm, and a curvature radius for slide bending is in a range of 0.3 mm to 2.0 mm in order to realize downsizing of the device on which the circuit board is mounted. The effect is exerted particularly in a case of use of sliding in which hard bending performance is required at a narrow gap in a range of 0.3 mm to 1 mm.

In a method of producing the flexible circuit board according to the present invention, the rolled metal foil exhibiting the cubic texture in which the [001] axis is finally aligned with the normal to the foil surface (perpendicular to surface of metal foil) may be bonded to the resin layer on the foil surface of the metal foil to manufacture a complex, and the wiring may be provided so that the design principal stress direction of bending, that is, the direction of the normal to the cross section of the wiring cut in the thickness direction from the ridge line in the bend portion is designed to form the ridge line of the bend portion at the angle in the range of 2.9° to 87.1° relative to the [100] principal orientation in the metal foil surface. The metal foil does not necessarily exhibit the cubic texture in an initial state. The cubic texture may be formed by thermal treatment. For example, thermal treatment may be performed to form the cubic texture during the process for producing the flexible circuit board, specifically, during the process for forming the resin layer. That is, thermal treatment is desirably performed to preferred-orient one of the fundamental crystal axes <100> of a unit lattice in the thickness direction of the metal foil so that an occupied area ratio of a region within an orientation difference of 10° relative to the <100> axis is equal to or larger than 50%, and to preferred-orient another one of the fundamental crystal axes <100> in a direction lateral to the surface of the metal foil so that the occupied area ratio of the region within the orientation difference of 10° relative to the <100> axis is equal to or larger than 50%. The rolled surface orientation of the recrystallized texture of the rolled copper foil is normally {100} and the rolled direction thereof is normally <100>. Therefore, the (001) principal orientation is provided as the rolled surface orientation, and hence the wiring is desirably provided so that the ridge line in the bend portion has the angle in the range of 2.9° to 87.1° relative to one of the fundamental crystal axes <001> in the surface of the metal foil, that is, the ridge line of the bend portion is formed at the angle in the range of 2.9° to 87.1° relative to the rolling direction.

As illustrated in FIG. 3, for example, when the flexible circuit board is bent into the U-shape, the ridge line L is formed outside (side opposed to side on which inscribed circle having curvature radius is produced). The ridge line L desirably has an inclination within α in a range of 2.9° to 87.1° in a state in which the ridge line is orthogonal to the [100] axis of the metal foil for forming the wiring. Examples of such a state are illustrated in FIGS. 4(a) and 4(b). Note that, FIGS. 4(c) and 4(d) illustrate states in which the ridge line is orthogonal to the [100] axis (α=0°. When α is smaller than 2.9°, a distinct effect in bendability is not found. When α is in a range of 11.4° to 78.6°, the bend durability of the bend structure is further improved. In the present invention, in the case of α=2.9°, the cross section P of the wiring cut in the direction of the thickness d from the ridge line corresponds to the (20 1 0) plane. In the case of α=45, the cross section P corresponds to the (110) plane. In the case of α=87.1, the cross section P corresponds to the (1 20 0) plane. In the case of cubic crystal, [100] and [010] are equivalent to each other, and hence the range of the angle α formed between the foil in-plane orthogonal axis of [100] and the ridge line as illustrated in FIGS. 4(a) and 4(b) is equal to the range of the angle formed between [100] and the normal to the cross section P and the range of the angle formed between [100] and the ridge line.

A width, shape, and pattern of the wiring are not particularly limited, and thus designed as appropriate depending on the use of the flexible circuit board or an electronic device on which the flexible circuit board is mounted. The bend structure in the present invention is excellent in bend durability, and hence it is unnecessary to form the wiring in an oblique direction relative to a turning axis of a hinge portion, for example, in order to reduce a bending stress of the wiring. Therefore, the wiring may be provided along the direction orthogonal to the ridge line in the bend portion, that is, the wiring may be provided with a minimum necessary distance. For example, FIGS. 4(a) and 4(b) illustrate examples of the flexible circuit board which is used for a hinge portion of a mobile phone and includes the resin layer 1, the wiring 2 made of the metal foil, and connector terminals 3. FIGS. 4(a) and 4(b) both illustrate the position of the ridge line L in the bend portion, which is close to the center. The ridge line L has an angle of (90+α)° relative to the direction of the [100] axis of the metal foil of the wiring 2. FIG. 4(a) illustrates an example in which the wiring is obliquely formed close to the ridge line L and between the connector terminals 3 provided at both ends. As illustrated in FIG. 4(b), the wiring may be formed between the connector terminals 3 in the shortest distance. As in a case of a fold type mobile phone, the position of the ridge line L in the bend portion may be fixed. As in a case of a slide type mobile phone, slide bending (bold arrow directions illustrated in FIG. 4(b)) may be made so that the ridge line L in the bend portion is shifted.

The flexible circuit board according to the present invention includes the wiring made of the metal foil provided on at least one of surfaces of the resin layer. If necessary, the metal foil may be provided on each of the surfaces of the resin layer. In this case, any of the metal foils are desirably provided so that the cross section of the wiring cut in the thickness direction from the ridge line in the bend portion is the predetermined surface in the present invention.

Hereinafter, the present invention is more specifically described with reference to examples and comparative examples. Note that, the types of the metal foil used in the examples and the synthesis of the polyamide acid solution are as follows.

[Copper Foil-A]
Rolled copper foil produced by Nippon Mining & Metals Co., Ltd. (product name BHYA-72F-HA), 12 µm in thickness
[Copper Foil-B]
Rolled copper foil produced by Fukuda Metal Foil & Powder Co., Ltd. (product name ROFD-T4X), 12 µm in thickness
[Copper Foil-C]
Rolled copper foil produced by Nippon Mining & Metals Co., Ltd. (product name BHY-22B-T), 18 µm in thickness
[Copper Foil-D]
Electrolytic copper foil produced by Furukawa Circuit Foil Co., Ltd. (product name U-WZ), 9 µm in thickness Synthesis of Polyamide Acid Solution Synthesis Example 1

N,N-dimethylacetamide was set in a reaction container which included a thermocouple and an agitator. Nitrogen may be introduced into the reaction container. Next, 2,2-bis[4-(4-aminophenoxy)phenyl]propane (BAPP) was dissolved while being agitated in the reaction container. Then, pyromellitic dianhydride (PMDA) was added. Charging was performed so that a total monomer charge amount was 15 wt %. After that, agitation was continued for three hours to obtain a resin solution of polyamide acid-a. A solution viscosity of the resin solution of polyamide acid-a was 3,000 cps.

Synthesis Example 2

N,N-dimethylacetamide was loaded in the reaction container which included a thermocouple and an agitator. Nitrogen may be introduced into the reaction container. Next, 2,2'-dimethyl-4,4'-diaminobiphenyl (m-TB) was charged to the reaction container. Then, 3,3',4,4'-biphenyl tetracarboxylic dianhydride (BPDA) and pyromellitic dianhydride (PMDA) were added. Charging was performed so that a total monomer charge amount was 15 wt % and a molar ratio between the respective acid anhydrides (BPDA:PMDA) was 20:80. After that, agitation was continued for three hours to obtain a resin solution of polyamide acid-b. A solution viscosity of the resin solution of polyamide acid-b was 20,000 cps.

Example 1

Figure 5:
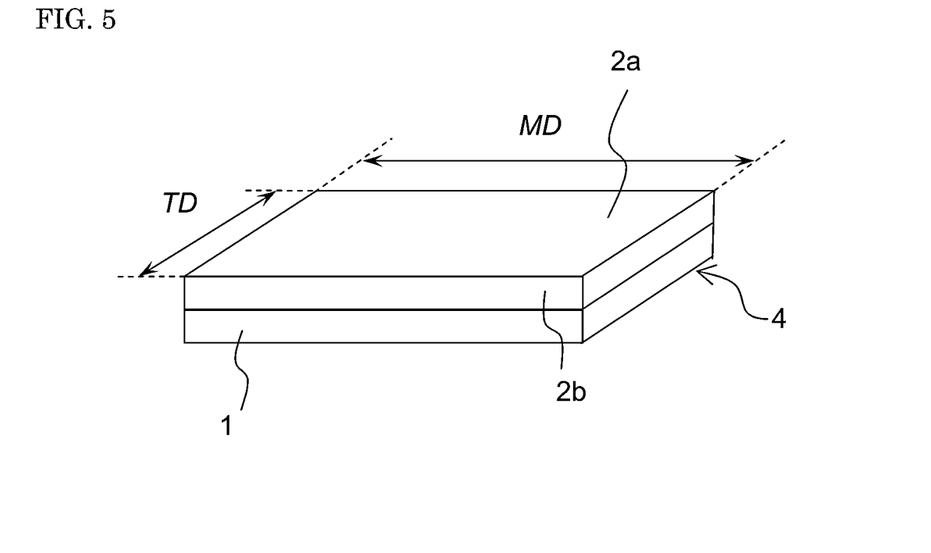
FIG. 5 is an explanatory perspective view illustrating a one-side copper-clad laminate.

The polyamide acid solution-a prepared as described above was applied to the copper foil-A and dried (thermoplastic polyimide film having thickness of 2 µm was formed after curing). Then, the polyamide acid-b was applied and dried (low-thermal expansion polyimide film having thickness of 12 µm was formed after curing). After that, the polyamide acid-a was applied and dried (thermoplastic polyimide film having thickness of 2 µm was formed after curing). Then, the copper foil-A was subjected to a heating condition for heating at a temperature in a range of 300° C. to 360° C. for an integral time equal to or longer than five minutes to form a polyimide layer having a three-layer structure. Next, the copper foil-A was cut into a rectangular size which has a length of 250 mm in a rolling direction (MD direction) and a width of 150 mm in a direction (TD direction) orthogonal to the rolling direction, to obtain a one-side copper-clad laminate 4 including the polyimide layer (resin layer) 1 having a thickness of 16 µm and the copper foil 2 having a thickness of 12 µm as illustrated in FIG. 5.

With respect to the obtained one-side copper-clad laminate 4, the intensity (I) was calculated from an intensity integral value of the (200) plane of a rolled surface 2a of the copper foil 2 which was obtained by X-ray diffraction, and then divided by the intensity ($I_0$) calculated from the intensity integral value of the (200) plane of the copper pure fine powder (produced by KANTO CHEMICAL CO., INC., copper powder reagent, first grade, 325 mesh) which was measured in advance, to calculate $I/I_0$. As a result, $I/I_0$ was 61. In the X-ray diffraction, a pole figure measurement apparatus RINT-2000 type (produced by Rigaku Corporation) was used and a Mo-Kα target was used. Respective intensity integral values of the (200) plane were obtained in conditions in which a tube voltage was 60 kV and a tube current was 200 mA. The intensity ratio was calculated based on a magnification for a solidified pure copper powder diffraction intensity.

A crystal orientation of the rolled surface 2a of the copper foil was measured by EBSP using FE-SEM (S-4100) produced by Hitachi, Ltd. A measurement region was a region of approximately 150 µm×75 µm. An accelerating voltage for measurement was 20 kV and a measurement step interval was 0.5 µm. OIM Analysis 5.2 and EBSP analysis software OIM4.6 which were produced by TSL Inc. were used for EBSP measurement and analysis. A surface of the obtained copper-clad laminate was ion-polished by a polisher (SM09010:JEOL).

Figure 7:
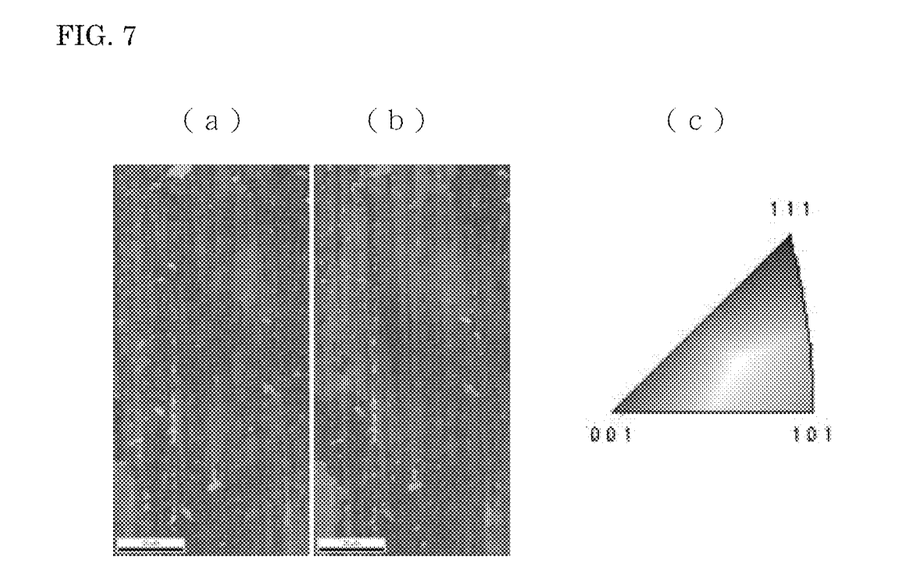
FIG. 7 illustrates an orientation mapping image of a metal foil which is obtained by an EBSP method in the example of the present invention.
Figure 8:
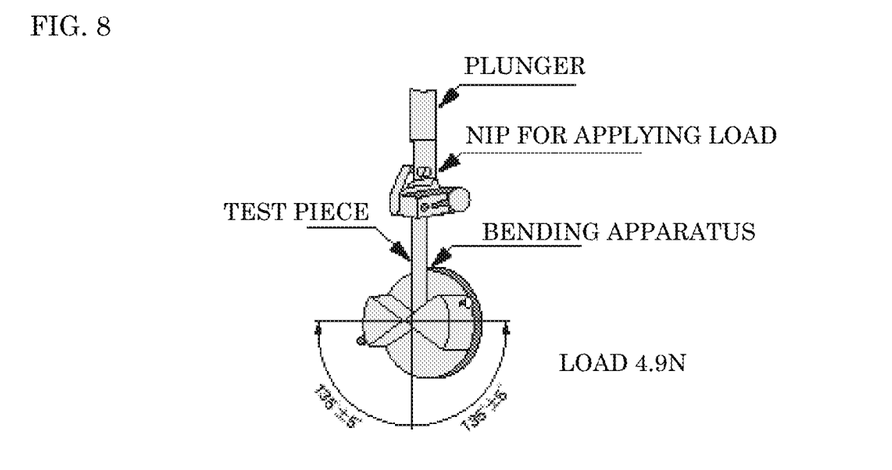
FIG. 8 is an explanatory view illustrating an MIT bending test apparatus.

A crystal orientation of the rolled surface 2a of the copper foil was examined. As a result, intense orientation to the (001) plane was determined in the inverse pole figure. A plane orientation including an orientation within 10° relative to a specific plane orientation was extracted by EBSP measurement. As a result, an occupied area ratio of the (001) plane was equal to or larger than 50% of the entire measurement area, and hence the (001) plane was dominant in the rolled surface 2a. FIG. 7(a) illustrates an inverse pole mapping image of the foil surface orientation of the obtained rolled surface 2a at this time. FIG. 7(b) illustrates a mapping color contour. A crystal orientation of the rolling (MD) orientation of the copper foil 2 was analyzed in the same manner. As a result, intense orientation to the (100) plane was determined. In addition, an occupied area ratio of the (100) plane was equal to or larger than 50% of the entire measurement area, and hence the (100) plane was dominant in the rolling (MD) orientation. FIG. 7(b) illustrates an inverse pole mapping image of the MD orientation of the copper foil. As is apparent from those results, the {100} plane is dominant in any of the rolled surface 2a and a side surface 2b of the copper foil 2, and hence it may be said that the [100] axis of copper is mainly provided along the rolling direction (MD direction) of the copper foil 2. Unless otherwise specified in the examples, the MD principal orientation plane is expressed by (100) and the MD principal orientation is expressed by [100].

Figure 6:
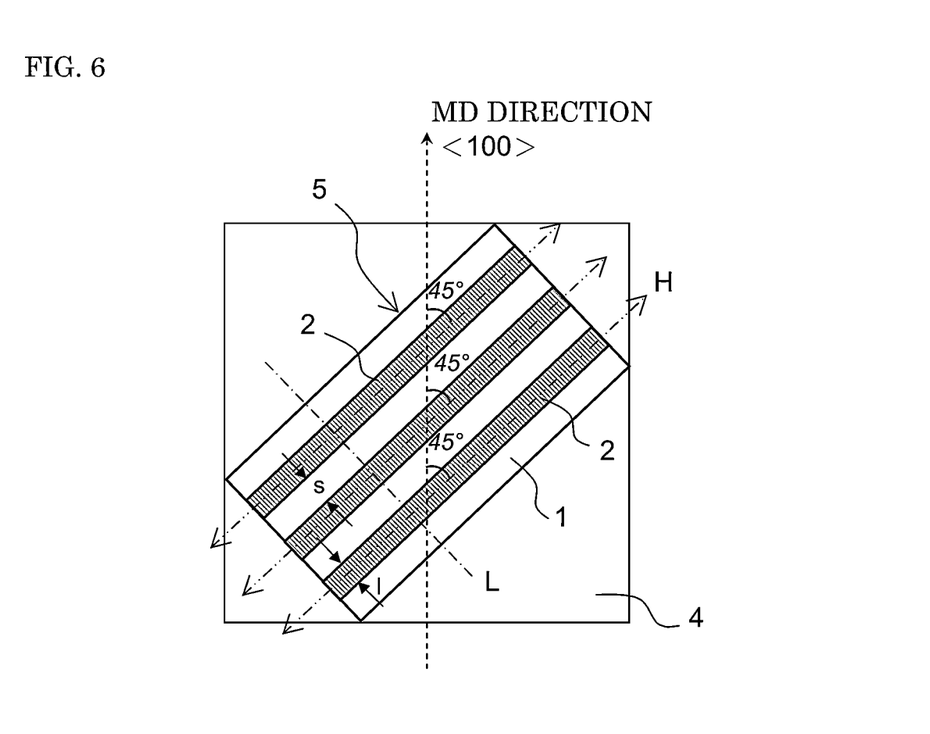
FIG. 6 is an explanatory plan view illustrating a state in which a test flexible circuit board is obtained from the one-side copper-clad laminate in an example of the present invention.

The copper foil 2 side of the obtained one-side copper-clad laminate 4 was covered with a predetermined mask and etched using an iron chloride/copper chloride solution to form a wiring pattern as illustrated in FIG. 6. The wiring pattern was formed at a space width (s) of 250 µm so that a wiring direction H (H direction) of the linear wiring 2 with a line width (l) of 150 µm has an angle of 45° relative to the MD direction ([100] axis). Then, a test flexible circuit board 5 also serving as a bending resistance test sample described later was obtained to have a length of 15 cm in the longitudinal direction along the wiring direction H of the circuit board and a width of 1.5 cm in the direction orthogonal to the wiring direction H, based on JIS 6471.

The obtained test flexible circuit board 5 was used to perform an MIT bending test based on JIS C5016. A bending test apparatus produced by Toyo Seiki Seisaku-sho, Ltd. (STROGRAPH-R1) was used. One end of the test flexible circuit board 5 in the longitudinal direction was held by a nip jig of the bending test apparatus and the other end thereof was held by a weight. During alternate right and left turning about a nip portion at 135±5 degrees in a condition in which a vibration rate was 150 times/minute, the circuit board was bent at a curvature radius of 0.8 mm and the number of turns immediately after the electrical connection of the wiring 2 of the circuit board 5 was broken was obtained as the number of bending. In this case, as illustrated in FIG. 6, the test was performed so that the ridge line L produced in the bend portion was orthogonal to the wiring direction H of the wiring 2 of the test flexible circuit board 5. As a result, it was determined that the wiring 2 was broken in the vicinity of the ridge line L of the bend portion when the number of bending reached 2,200 times. Results are shown in Table 1.

In the test flexible circuit board 5 according to this example, the wiring 2 was formed so that the wiring direction H was inclined at 45° relative to the [100] axis of copper. Therefore, it may be said that the cross section of the wiring 2 cut in the thickness direction of the circuit board 5 from the ridge line L in the bending test is the (110) plane. That was, in this example, the rolled surface 2a is the (001) plane and the side surface 2b is the (010) plane, and hence it may be said that the cubic crystals of the crystal texture of the copper foil are aligned in the MD direction ([100] axis) of the copper foil surface. As shown in Table 2, an angle relationship between the (100) plane and an $(h_2k_2l_2)$ plane in the case of cubic crystal is known, and hence it may be said that the cross section obtained by cutting in the thickness direction of the circuit board 5 from the ridge line L in this example is the (110) plane. Note that, numerical values in Table 2 are cited from Phys. Rev., 26, 390 (1925).

TABLE 1

|  |  | $I/I_0$ | Angle formed between MD direction and H direction (°) | The number of bending (times) |
|---|---|---|---|---|
| Example | 1 | 61 | 45 | 2200 |
|  | 2 | 61 | 15 | 2200 |
|  | 3 | 61 | 30 | 2100 |
|  | 4 | 61 | 60 | 2100 |
|  | 5 | 61 | 75 | 2000 |
|  | 6 | 43 | 15 | 1100 |
|  | 7 | 43 | 30 | 1100 |
|  | 8 | 43 | 45 | 1200 |
|  | 9 | 33 | 15 | 1100 |
|  | 10 | 33 | 30 | 1100 |
|  | 11 | 33 | 45 | 1200 |
| Comparative Example | 1 | 61 | 0 | 1100 |
|  | 2 | 61 | 85 | 1000 |
|  | 3 | 61 | 90 | 1100 |
|  | 4 | 43 | 0 | 800 |
|  | 5 | 33 | 0 | 800 |
|  | 6 | 10 | 0 | 400 |
|  | 7 | 7 | 0 | 600 |

TABLE 2

Angle between (100) and $(h_2k_2l_2)$ planes of cubic crystal

| $(h_2k_2l_2)$ | (100) |
|---|---|
| 100 | 0° |
|  | 90° |
| 110 | 45° |
|  | 90° |
| 111 | 54.7° |
| 210 | 26.6° |
|  | 63.4° |
|  | 90° |
| 211 | 35.3° |
|  | 65.9° |
| 221 | 48.2° |
|  | 70.5° |
| 310 | 18.4° |
|  | 71.6° |
|  | 90° |
| 311 | 25.2° |
|  | 72.5° |
| 320 | 33.7° |
|  | 56.3° |
|  | 90° |
| 321 | 36.7° |
|  | 57.7° |
|  | 74.5° |
| 331 | 46.5° |
| 510 | 114° |
| 511 | 15.6° |
| 711 | 11.3° |

Examples 2 to 5

The polyimide layer was formed for the copper foil-A in the same manner as in Example 1 to obtain the one-side copper-clad laminate 4. The respective test flexible circuit boards 5 were prepared in the same manner as in Example 1 except for the point that the angle of the wiring direction H relative to the MD direction ([100] axis) in the obtained one-side copper-clad laminate 4 was set as shown in Table 1. The obtained circuit boards 5 were subjected to the MIT bending test in the same manner as in Example 1. Results are shown in Table 1.

Examples 6 to 8

The one-side copper-clad laminates 4 according to Examples 6 to 8 were obtained in the same manner as in Example 1 except for the point that the heating integral time in the heating condition for forming the polyimide layer on a surface-treated surface of the copper foil-A was set to two minutes. In each of the obtained one-side copper-clad laminates 4, $I/I_0$ was obtained in the same manner as in Example 1. As a result, $I/I_0$ was 43. In each of the obtained one-side copper-clad laminates 4, the crystal orientations of the rolled surface 2a orientation (MD orientation) and the side surface 2b orientation (TD orientation) of the copper foil were analyzed by the EBSP method in the same manner as in Example 1. As a result, the {100} plane was dominant in any of the orientations. Therefore, it was determined that the rolling direction (MD direction) of the copper foil 2 of the one-side copper-clad laminates 4 according to each of Examples 6 to 8 had the [100] axis of copper.

The respective test flexible circuit boards 5 were prepared in the same manner as in Example 1 except for the point that the angle of the wiring direction H relative to the MD direction ([100] axis) in the obtained one-side copper-clad laminate 4 was set as shown in Table 1. The obtained circuit boards 5 were subjected to the MIT bending test in the same manner as in Example 1. Results are shown in Table 1.

Examples 9 to 11

The one-side copper-clad laminates 4 according to Examples 9 to 11 were obtained in the same manner as in Example 1 except for the point that the copper foil-B was used and the heating integral time in the heating condition for forming the polyimide layer on a surface-treated surface of the copper foil-B was set to two minutes. In each of the obtained one-side copper-clad laminates 4, $I/I_0$ was obtained in the same manner as in Example 1. As a result, $I/I_0$ was 33. In each of those one-side copper-clad laminates 4, the crystal orientations of the rolled surface 2a and the side surface 2b of the copper foil were analyzed by the EBSP method in the same manner as in Example 1. As a result, the (100) plane was dominant in any of the orientations. Therefore, it was determined that the rolling direction (MD direction) of the copper foil 2 of the one-side copper-clad laminates 4 according to each of Examples 9 to 11 had the [100] axis of copper.

The respective test flexible circuit boards 5 were prepared in the same manner as in Example 1 except for the point that the angle of the wiring direction H relative to the MD direction ([100] axis) in the obtained one-side copper-clad laminate 4 was set as shown in Table 1. The obtained circuit boards 5 were subjected to the MIT bending test in the same manner as in Example 1. Results are shown in Table 1.

Comparative Examples 1 to 3

The respective test flexible circuit boards 5 were prepared in the same manner as in Example 1 except for the point that the angle of the wiring direction H relative to the MD direction ([100] axis) in the one-side copper-clad laminate 4 obtained in the same manner as in Example 1 was set as shown in Table 1. The obtained circuit boards 5 were subjected to the MIT bending test in the same manner as in Example 1. Results are shown in Table 1.

Comparative Example 4

The one-side copper-clad laminates 4 were obtained in the same manner as in Example 1 except for the point that the heating integral time in the heating condition for forming the polyimide layer on a surface-treated surface of the copper foil-A was set to two minutes. In each of the obtained one-side copper-clad laminates 4, $I/I_0$ was obtained in the same manner as in Example 1. As a result, $I/I_0$ was 43. The crystal orientations of the rolled surface 2a orientation (MD orientation) and the side surface 2b orientation (TD orientation) of the copper foil were analyzed in the same manner as in Example 1. As a result, the (100) plane was dominant in any of the orientations. Therefore, it was determined that the rolling direction (MD direction) of the copper foil 2 of those one-side copper-clad laminates 4 had the [100] axis of copper. The respective test flexible circuit boards 5 were prepared in the same manner as in Example 1 except for the point that the angle of the wiring direction H relative to the MD direction ([100] axis) in the obtained one-side copper-clad laminate 4 was set to 0° as shown in Table 1. The circuit boards 5 were subjected to the MIT bending test. Results are shown in Table 1.

Comparative Example 5

The one-side copper-clad laminates 4 according to Examples 6 to 8 were obtained in the same manner as in Example 1 except for the point that the copper foil-B was used and the heating integral time in the heating condition for forming the polyimide layer on a surface-treated surface of the copper foil-B was set to two minutes. In each of the obtained one-side copper-clad laminates 4, $I/I_0$ was obtained in the same manner as in Example 1. As a result, $I/I_0$ was 33. The crystal orientations of the rolled surface 2a orientation (MD orientation) and the side surface 2b orientation (TD orientation) were analyzed in the same manner as in Example 1. As a result, the (100) plane was dominant in any of the orientations. Therefore, it was determined that the rolling direction (MD direction) of the copper foil 2 of those one-side copper-clad laminates 4 had the axis of copper. The respective test flexible circuit boards 5 were prepared in the same manner as in Example 1 except for the point that the angle of the wiring direction H relative to the MD direction ([100] axis) in the obtained one-side copper-clad laminate 4 was set as shown in Table 1. The circuit boards 5 were subjected to the MIT bending test. Results are shown in Table 1.

Comparative Example 6

The respective one-side copper-clad laminates 4 were obtained in the same manner as in Example 1 except for the point that the copper foil-C was used. In each of the obtained one-side copper-clad laminates 4, $I/I_0$ was obtained in the same manner as in Example 1. As a result, $I/I_0$ was 10. The respective test flexible circuit boards 5 were prepared in the same manner as in Example 1 except for the point that the angle of the wiring direction H relative to the MD direction in the obtained one-side copper-clad laminate 4 was set to 0° as shown in Table 1. The circuit boards 5 were subjected to the MIT bending test. Results are shown in Table 1.

Comparative Example 7

The respective one-side copper-clad laminates 4 were obtained in the same manner as in Example 1 except for the point that the copper foil-D was used. In each of the obtained one-side copper-clad laminates 4, $I/I_0$ was obtained in the same manner as in Example 1. As a result, $I/I_0$ was 7. The respective test flexible circuit boards 5 were prepared in the same manner as in Example 1 except for the point that the angle of the wiring direction H relative to the MD direction ([100] axis) in the obtained one-side copper-clad laminate 4 was set to 0° as shown in Table 1. The circuit boards 5 were subjected to the MIT bending test. Results are shown in Table 1.

Example 12

The polyamide acid solution-a prepared in the same manner as Synthesis Example 1 was applied to a rolled copper foil-E which was 99.9 mass % in purity and 12 μm in thickness and dried (thermoplastic polyimide film having thickness of 2 μm was formed after curing). Then, the polyamide acid-b was applied and dried (low-thermal expansion polyimide film having thickness of 12 μm was formed after curing). After that, the polyamide acid-a was applied and dried (thermoplastic polyimide film having thickness of 2 μm was formed after curing). Then, heating was performed under a heating condition that a temperature was in a range of 180° C. to 240° C. and an integral time was 10 minutes, to form a polyimide layer.

Next, the copper foil was cut into the rectangular size which had a length of 250 mm in the rolling direction (MD direction) and a width of 150 mm in the direction (TD direction) orthogonal to the rolling direction, to obtain the one-side copper-clad laminate 4 including the polyimide layer (resin layer) 1 having a thickness of 12 μm and the copper foil 2 having a thickness of 12 μm. The copper foil side of the obtained one-side copper-clad laminate 4 was covered with a predetermined mask and etched using an iron chloride/copper chloride solution to form a low-speed IPC test circuit 2 including a linear wiring which was 150 μm in line width and 250 μm in space width, based on the IPC standards. During the manufacturing process, a maximum temperature in the heating condition for forming the polyimide layer was changed to four levels, 180° C. (Condition A), 200° C. (Condition B), 220° C. (Condition C), and 240° C. (Condition D). Respective wiring patterns were formed so that the wiring direction (H direction) of the linear wiring 2 had 22-level angles, 0°, 2°, 2.9°, 5.7°, 9.5°, 11.4°, 14°, 18.4°, 25°, 26.6°, 30°, 40°, 45°, 55°, 60°, 63.4°, 78.6°, 80°, 82.9°, 87.1°, 88°, and 90° relative to the rolling direction (MD direction). Next, a cover material 7 (produced by Arisawa Manufacturing Co., Ltd., CVK-0515KA, 12.5 μm in thickness) was laminated on each circuit side surface by an epoxy bonding material. A thickness of a bonding layer 6 containing the bonding material was 15 μm in a region in which a copper foil circuit was not provided and 6 μm in a region in which the copper foil circuit was provided. Cutting was performed so that a length was 15 cm in the longitudinal direction along the wiring direction (H direction) and a width was 8 mm in the direction orthogonal to the wiring direction, to obtain a test flexible circuit board to be used as an IPC test sample.

With respect to specimens for EBSP texture analysis, 20 specimens having no wiring pattern, which were obtained by cutting at five angles, 0°, 2.9°, 30°, 63.4°, and 78.6° relative to the rolling direction in one-side copper-clad laminates produced in the thermal treatment conditions A to D, were manufactured in total. In order to obtain the same thermal hysteresis as the IPC test sample, the same simulated thermal treatment as circuit formation etching was applied and the cover material was laminated in the same condition. It was found later that the influence on the copper foil texture was minor and hence the copper foil texture was determined depending on the thermal treatment conditions-A to -D for polyimide formation.

As described above, the 20 copper foils-E having the four levels of thermal treatment conditions provided for EBSP measurement and the five levels of angle conditions were polished in the board thickness direction to have surfaces horizontal to the foil surfaces before polishing, to thereby expose the foil surfaces of the copper foils-E. Then, final polishing was performed using colloidal silica to evaluate the textures of the copper foils-E by EBSP. A measurement region was set to 0.8 mm×1.6 mm and a measurement interval was set to 4 μm. That was, the number of measurement points of each region was 80,000. As a result, it was found that any of the specimens obtained by thermal treatment in the thermal treatment conditions of Conditions-A to -D formed the cubic texture and had the principal orientation of {001}<100> in the copper foil surface orientation, or the rolling direction. The number of points having the unit lattice axis <001> of within 10° relative to the thickness direction of the copper foil and the rolling direction was counted based on the obtained results, and a ratio with respect to the total number of points was calculated, thereby obtaining an average value. Results are shown in Table 3. A deviation between the specimens in the same heating condition was equal to or smaller than 1%, and hence it may be said that the integration degree illustrated in Table 3 is obtained over the entire surface of the copper foil in the same thermal treatment condition. It was found that, when the maximum thermal treatment temperature was high and the thermal hysteresis was large, recrystallization was promoted and the integration degree of the cubic recrystallization texture was high. Foil in-plane orientation analysis was performed. As a result, principal orientations in a cutting direction of a specimen cut at five angles of 0°, 2.9°, 30°, 63.4°, and 78.6° relative to the rolling direction were [100], [20 1 0], [40 23 0], [120], and [150], and thus were substantially the predetermined orientations.

TABLE 3

| | Integration degree of <001> in thickness direction of copper foil and rolling direction | |
|---|---|---|
| Heating condition | Foil thickness direction | Rolling direction |
| Condition-A | 46% | 49% |
| Condition-B | 50% | 50% |
| Condition-C | 75% | 85% |
| Condition-D | 98% | 99% |

Figure 9:
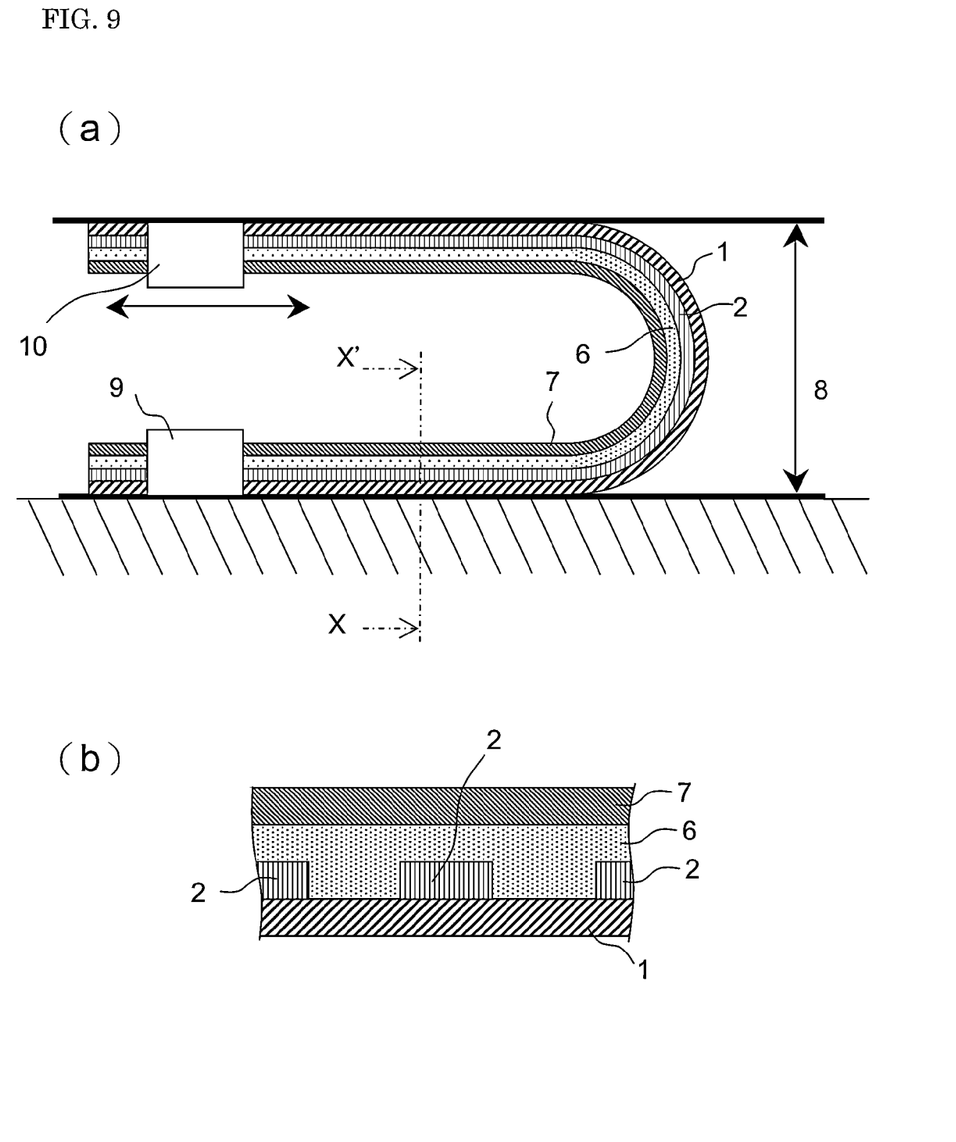
FIG. 9(a) is an explanatory view illustrating an IPC bending test apparatus and FIG. 9(b) is an X-X' cross sectional view illustrating a test flexible circuit board used for the IPC bending test.

As schematically illustrated in FIG. 9, the IPC test is a simulation test of slide bending which is one of bending modes used for, for example, a mobile phone. The IPC test is a test in which, as illustrated in FIG. 9, a bend portion is provided with a predetermined gap length 8, one side thereof is held by a fixed portion 9, and a slide operation portion 10 located on an opposite side is repeatedly reciprocated. Therefore, the board is repeatedly bent in a region corresponding to a stroke amount of the reciprocated portion. In this example, repeated sliding test was performed with the polyimide layer (resin layer) 1 located outside, the gap length set to 1 mm, that was, a bending radius set to 0.5 mm, and a stroke of 38 mm. During the test, an electrical resistance of a circuit of the test flexible circuit board was measured. The degree of development of a fatigue crack of the copper foil circuit was monitored based on an increased electrical resistance. In this example, the number of strokes at which the electrical resistance of the circuit reached two times an initial value was set as a circuit break life.

The test was performed at 88 levels in total for a case where wiring patterns having 22-level angles were formed in the four thermal treatment conditions of Conditions-A to -D described above. In each of the test levels, four test pieces were measured to average the number of strokes at which the circuit was broken. A cross section of the copper foil after the lapse of the circuit break life which was cut in the thickness direction with the copper foil made orthogonal to the slide direction was observed using a scanning electron microscope. As a result, it was observed that cracks were formed in the respective surfaces of the copper foil on the resin layer side and the cover material side at different degrees, and a large number of cracks were particularly introduced into the surface of the copper foil on the resin layer side corresponding to the outside of the bend portion.

Average values of circuit break lives in the respective levels are shown in Table 4. Angle boxes of Table 4 also illustrate a plane index only in a case where the cross section P of the wiring cut in the circuit length direction (wiring direction), that is, in the thickness direction from the ridge line in the bend portion was a low-index direction.

TABLE 4

Fatigue life in IPC test

| Angle formed between circuit length direction and rolling direction (plane index of cross section P) | | Condition A | Condition B | Condition C | Condition E |
|---|---|---|---|---|---|
| 0° | (100) | 15,200 | 16,500 | 28,600 | 32,900 |
| 2° | | 14,900 | 16,500 | 28,500 | 34,100 |
| 2.9° | (20 1 0) | 15,100 | 20,200 | 30,500 | 48,200 |
| 5.7° | (10 1 0) | 14,800 | 21,000 | 33,000 | 49,100 |
| 9.5° | (610) | 15,000 | 22,500 | 33,500 | 49,900 |
| 11.4° | (510) | 14,700 | 25,800 | 38,000 | 54,200 |
| 14° | (410) | 15,600 | 25,600 | 39,000 | 58,400 |
| 18.4° | (310) | 14,200 | 26,200 | 38,400 | 59,800 |
| 25° | | 15,200 | 27,000 | 38,900 | 58,900 |
| 26.6° | (210) | 14,100 | 27,200 | 43,000 | 62,500 |
| 30° | | 14,900 | 27,500 | 45,100 | 65,900 |
| 40° | | 14,000 | 27,100 | 43,100 | 63,000 |
| 45° | (110) | 13,800 | 26,900 | 42,900 | 62,600 |
| 55° | | 12,800 | 27,000 | 43,500 | 62,200 |
| 60° | | 13,800 | 27,200 | 44,900 | 65,000 |
| 63.4° | (120) | 13,400 | 24,900 | 42,500 | 62,000 |
| 78.6° | (150) | 12,500 | 24,800 | 39,000 | 58,200 |
| 80° | | 12,800 | 20,200 | 32,500 | 48,900 |
| 82.9° | (180) | 12,700 | 19,900 | 32,400 | 46,800 |
| 87.1° | (1 20 0) | 13,000 | 18,900 | 32,200 | 45,000 |
| 88° | | 13,000 | 15,800 | 28,000 | 31,000 |
| 90° | (010) | 12,900 | 15,900 | 27,900 | 30,900 |

It was found that the fatigue life in the IPC test greatly depended on the angle formed between the circuit length direction (wiring direction) and the rolling direction, that was, the angle formed between the direction of the normal to the cross section of the wiring cut in the thickness direction from the ridge line in the bend portion and [100]. The orientation dependence was exhibited in the condition-B, the condition-C, and the condition-D. When the integration degree of the cubic orientation was high, the fatigue life with respect to repeated bending was long and the orientation dependence was large. It was determined that the orientation dependence was exhibited in a case where the principal orientation of <001> was preferred-oriented in the thickness direction of the metal foil so that an occupied area ratio of a region in which [001] of copper was within an orientation difference of 10° relative to the thickness direction of the metal foil was equal to or larger than 50% in EBSP method estimation, and the principal orientation of [100] was preferred-oriented in the surface of the metal foil so that an occupied area ratio of a region which was located within an orientation difference of 10° relative to the [100] axis of copper was equal to or larger than 50% in EBSP method estimation. In particular, it was found that, in the case of the condition-C in which an area ratio equal to or larger than 75% and an area ratio equal to or larger than 85% were exhibited in the thickness direction and the rolling direction, respectively, and the integration degree of the cubic orientation was high, the fatigue life was long, and an effect of the orientation dependence was large. In addition, in the case of the condition-D in which an area ratio equal to or larger than 98% and an area ratio equal to or larger than 99% were exhibited in the thickness direction and the rolling direction, respectively, and the integration degree of the cubic orientation was extremely high, the fatigue life was further long, and an effect of the orientation dependence was further large.

The results of the condition-A, the condition-B, and the condition-C were reviewed in detail. Then, when the direction of the normal to the cross section of the wiring cut in the thickness direction from the ridge line in the bend portion, that was, the principal stress direction was deviated from the principal orientation of <100> of the copper foil, the fatigue life of the circuit to bending was high. In the IPC test preformed in this example, an effect was exhibited in the case where there was the angle in the range of 2.9° to 87.1° relative to the principal distortion direction of the bend portion, that is, the direction of the normal to the cross section of the wiring cut in the thickness direction from the ridge line in the bend portion. When this was expressed by the plane index, the cross section P of the wiring cut in the thickness direction from the ridge line in the bend portion was in a range of from (20 1 0) to (1 20 0) through (110) with [001] set as the zone axis. A large effect was exhibited particularly in the case where there was the angle in the range of 11.4° to 78.6° relative to the principal distortion direction of the bend portion, that is, the direction of the normal to the cross section of the wiring cut in the thickness direction from the ridge line in the bend portion. When this was expressed by the plane index, the cross section P of the wiring cut in the thickness direction from the ridge line in the bend portion was in a range of from (510) to (150) through (110) with [001] set as the zone axis. The bending characteristic was further high in the case where there was the angle in the range of 26.6° to 63.4° relative to the principal distortion direction of the bend portion, that is, the direction of the normal to the cross section of the wiring cut in the thickness direction from the ridge line in the bend portion, and was most excellent in the cases of 30° and 60°. When this was expressed by the plane index, the cross section P was in a range of from (210) to (120) through (110) with [001] set as the zone axis. The cases of vicinities of (40 23 0) and (23 40 0) were most excellent.

When the orientation of the cross section of the wiring cut in the thickness direction from the ridge line in the bend portion was set to (100), which was normal usage of the rolled copper foil, the Schmid factors of the eight slip planes became equal to one another during bending. Therefore, the eight slip systems simultaneously acted, and hence dislocations were easily locally accumulated. In contrast to this, when the special structure was employed in which the orientation except (100) was set as the orientation of the cross section of the wiring as in the present invention, the eight slip planes were divided into four principal slip systems and four secondary slip systems. Therefore, it is expected that, in an initial stage of deformation, only the four principal sliding systems act and dislocations are less likely to be accumulated, thereby improving the fatigue characteristic. The most desired orientation was 30° or 60° relative to the principal distortion direction of the bend portion, that is, the direction of the normal to the cross section of the wiring cut in the thickness direction from the ridge line in the bend portion. This is because the stress direction is aligned with the stable orientation of tension.

Considering the mechanism described above, the metal foil of the wiring is required to exhibit the cubic structure. However, the cross section of the wiring cut in the thickness direction from the ridge line in the bend portion only needs to form the principal orientation on any plane within a range of (21 1 0) to (1 20 0) in a rotation direction from (100) to (110) with [001] set as the zone axis. Even when the metal foil is turned in the surface of the foil by 90°, this is equivalent in view of symmetry. The mechanism described above is established in the case of not only copper but also another face-centered cubic metal having the same slip plane and slip direction. Thus, a metal foil made of aluminum, nickel, silver, rhodium, molybdenum, or tungsten, or an alloy foil having a face-centered cubic structure also obviously exhibits the same effect.

INDUSTRIAL APPLICABILITY

The flexible circuit board according to the present invention may be widely used for various electronic or electrical devices, and is suitable to be used with the bend portion provided at any position in the case where the circuit board itself is folded, twisted, or deformed depending on the operation of a device in which the circuit board is installed. In particular, the flexible circuit board according to the present invention has the bend structure which is excellent in bend durability, and thus is suitable for the case where folding is frequently performed with repeated operations including sliding bending, fold bending, hinge bending, and slide bending, or the case where the bend portion required to have a very small curvature radius is to be formed in order to satisfy a reduced size of the device in which the circuit board is installed. Therefore, the flexible circuit board according to the present invention may be suitably applied to various electronic devices including a thin mobile phone, a thin display, a hard disk drive, a printer, and a DVD drive, which are required to have durability.

REFERENCE SIGNS LIST

1: resin layer
2: wiring (metal foil)
2$a$: rolled surface
2$b$: side surface
3: connector terminal
4: one-side copper-clad laminate
5: test flexible circuit board
6: bonding layer
7: cover material
8: gap length
9: fixed portion
10: slide operation portion
21: direction of normal to cross section P
L: ridge line
P: cross section of wiring cut in thickness direction from ridge line in bend portion

The invention claimed is:

1. A method of producing a flexible circuit board including a resin layer and a wiring formed of a metal foil, to be used with a bend portion provided at least at one position of the wiring, the method comprising:
   manufacturing a metal-clad laminate having the metal foil and the resin layer,
   wherein the metal foil comprises a rolled copper foil having a rolling direction MD aligned with a <100> axis direction of the rolled copper foil, and
   wherein $I/I_0 \geq 25$ is satisfied between an intensity (I) of a (200) plane of the rolled copper foil in the thickness direction, which is obtained by X-ray diffraction, and an intensity ($I_0$) of a (200) plane of a copper fine powder which is obtained by X-ray diffraction,
   the method further comprising forming a linear wiring so as to have an angle in a range of 26.6° to 63.4° relative to the rolling direction MD of the copper foil so that a cross section of the wiring cut in a thickness direction from a ridge line in the bend portion forms a principal orientation on any one of planes within a range of (210) to (120) in a rotation direction from (100) to (110) with [001] set as a zone axis;
   wherein the forming of the linear wiring comprises performing thermal treatment on a rolled copper foil having a face-centered cubic structure to exhibit a cubic texture;
   wherein the cubic crystal exhibits a preferred orientation in which an occupied area ratio of a region in which one of fundamental crystal axes <100> of a unit lattice of the face-centered cubic structure is located within an orientation difference of 10° relative to a thickness direction of the metal foil is equal to or larger than 50%, and exhibits a preferred orientation in which an occupied area ratio of a region in which another one of the fundamental crystal axes <100> of a unit lattice of the face-centered cubic structure is located within an orientation difference of 10° relative to a direction in a foil surface is equal to or larger than 50%.

2. The method of producing a flexible circuit board according to claim 1, wherein the bend portion is formed with a repeated operation selected from the group consisting of sliding bending, fold bending, hinge bending, and slide bending.

3. The method of producing a flexible circuit board according to claim 1, wherein the forming comprises forming the wiring along a direction orthogonal to the ridge line at the bend portion.

4. The method of producing a flexible circuit board according to claim 1, wherein $I/I_0 > 33$ is satisfied between an intensity (I) of a (200) plane of the rolled copper foil in the thickness direction, which is obtained by X-ray diffraction, and an intensity ($I_0$) of a (200) plane of a copper fine powder which is obtained by X-ray diffraction.

* * * * *